(12) United States Patent
Biber et al.

(10) Patent No.: US 10,114,091 B2
(45) Date of Patent: Oct. 30, 2018

(54) AUTOMATIC DETUNING OF NON-CONNECTED TRANSCEIVER COILS FOR MRI

(71) Applicants: Stephan Biber, Erlangen (DE); Klaus Huber, Effeltrich (DE)

(72) Inventors: Stephan Biber, Erlangen (DE); Klaus Huber, Effeltrich (DE)

(73) Assignee: Siemens Aktiengesellschaft, München (DE)

( * ) Notice: Subject to any disclaimer, the term of this patent is extended or adjusted under 35 U.S.C. 154(b) by 1209 days.

(21) Appl. No.: 13/929,746

(22) Filed: Jun. 27, 2013

(65) Prior Publication Data

US 2014/0002085 A1    Jan. 2, 2014

(30) Foreign Application Priority Data

Jun. 28, 2012 (DE) .................. 10 2012 211 147

(51) Int. Cl.
  *G01R 33/36* (2006.01)
  *G01R 33/28* (2006.01)
  *G01R 33/341* (2006.01)

(52) U.S. Cl.
  CPC ....... *G01R 33/3628* (2013.01); *G01R 33/288* (2013.01); *G01R 33/365* (2013.01); *G01R 33/341* (2013.01)

(58) Field of Classification Search
  CPC .. G01R 33/288; G01R 33/341; G01R 33/365; G01R 33/3628
  See application file for complete search history.

(56) References Cited

U.S. PATENT DOCUMENTS

| | | | |
|---|---|---|---|
| 4,782,298 A | | 11/1988 | Arakawa et al. |
| 5,278,505 A | * | 1/1994 | Arakawa ............ G01R 33/341 |
| | | | 324/311 |
| 5,666,055 A | * | 9/1997 | Jones ................ G01R 33/3415 |
| | | | 324/318 |
| 6,236,205 B1 | * | 5/2001 | Ludeke .................. A61B 5/06 |
| | | | 324/300 |
| 6,263,229 B1 | | 7/2001 | Atalar et al. |
| 6,414,488 B1 | | 7/2002 | Chmielewski |
| 6,838,963 B2 | * | 1/2005 | Zimmerling ........... A61N 1/37 |
| | | | 335/205 |
| 6,850,067 B1 | | 2/2005 | Burl et al. |
| | | (Continued) | |

FOREIGN PATENT DOCUMENTS

| | | |
|---|---|---|
| CN | 101256222 A | 9/2008 |
| CN | 101529266 A | 9/2009 |
| | (Continued) | |

OTHER PUBLICATIONS

Korean Notice of Allowance for related Korean Application No. 10-2013-0073094, dated Apr. 28, 2016, with English Translation.
(Continued)

*Primary Examiner* — Dixomara Vargas
(74) *Attorney, Agent, or Firm* — Lempia Summerfield Katz LLC

(57) ABSTRACT

Methods and a device for automatic detuning of a magnetic resonance tomography (MRT) local coil not connected to an MRT system are provided. The device has self-closing switches that are closed or open, depending on the presence of an MRT high-frequency field.

19 Claims, 5 Drawing Sheets

(56) References Cited

U.S. PATENT DOCUMENTS

| | | | | |
|---|---|---|---|---|
| 7,091,806 B2 * | 8/2006 | Zimmerling | ............ | A61N 1/37 200/404 |
| 7,566,296 B2 * | 7/2009 | Zimmerling | ............ | A61N 1/37 335/305 |
| 7,728,591 B2 * | 6/2010 | Weizenecker | ..... | G01R 33/3415 324/318 |
| 7,800,368 B2 * | 9/2010 | Vaughan | ............ | G01R 33/583 324/318 |
| 7,855,559 B2 * | 12/2010 | DeFranco | .......... | G01R 33/3657 324/322 |
| 7,906,966 B1 * | 3/2011 | Votruba | ............ | G01R 33/3415 324/318 |
| 7,976,453 B2 * | 7/2011 | Zimmerling | ............ | A61N 1/37 335/305 |
| 8,032,228 B2 * | 10/2011 | Ameri | ................... | A61N 1/056 128/901 |
| 8,118,725 B2 * | 2/2012 | Zimmerling | ............ | A61N 1/37 335/305 |
| 8,301,249 B2 * | 10/2012 | Min | ....................... | A61N 1/056 607/116 |
| 8,339,256 B2 * | 12/2012 | Weiss | ................... | G01R 33/285 340/531 |
| 8,391,992 B2 * | 3/2013 | Lyden | ...................... | A61N 1/08 607/63 |
| 8,427,158 B2 * | 4/2013 | Huish | ............. | G01R 33/34007 324/318 |
| 8,509,913 B2 * | 8/2013 | Johnson | ................. | A61B 5/055 607/60 |
| 8,554,335 B2 * | 10/2013 | Ameri | ................... | A61N 1/056 128/901 |
| 8,583,201 B2 * | 11/2013 | Wu | .......................... | H01F 6/02 505/162 |
| 8,698,500 B2 * | 4/2014 | Vester | ............... | G01R 33/3415 324/318 |
| 8,754,644 B2 * | 6/2014 | Trakic | ................. | G01R 33/422 324/307 |
| 8,855,785 B1 * | 10/2014 | Johnson | ............... | A61N 1/3718 607/63 |
| 8,911,448 B2 * | 12/2014 | Stein | ....................... | A61F 2/442 606/102 |
| 9,063,199 B2 * | 6/2015 | Greim | ................ | G01R 33/3621 |
| 9,097,769 B2 * | 8/2015 | Schillak | ............ | G01R 33/3607 |
| RE45,701 E * | 9/2015 | Zimmerling | ............ | A61N 1/37 |
| RE46,057 E * | 7/2016 | Zimmerling | | |
| 9,459,331 B2 * | 10/2016 | Otake | ................. | G01R 33/365 |
| 9,500,727 B2 * | 11/2016 | Sohn | ............... | G01R 33/34092 |
| 9,519,038 B2 * | 12/2016 | Okamoto | ........... | G01R 33/3692 |
| 9,638,771 B2 * | 5/2017 | Soutome | ............... | A61B 5/055 |
| 9,817,091 B2 * | 11/2017 | Ishii | ................... | G01R 33/3692 |
| 2002/0080911 A1 | 6/2002 | Friedrich et al. | | |
| 2005/0127914 A1 | 6/2005 | Eberler et al. | | |
| 2010/0039113 A1 | 2/2010 | Vartiovaara | | |
| 2010/0277175 A1 | 11/2010 | Weiss | | |
| 2011/0291655 A1 | 12/2011 | Hamamura et al. | | |
| 2012/0081115 A1 | 4/2012 | Reykowski | | |

FOREIGN PATENT DOCUMENTS

| | | |
|---|---|---|
| DE | 10051155 C2 | 9/2002 |
| DE | 10314215 B4 | 11/2006 |
| EP | 0305830 A2 | 3/1989 |
| JP | H10155761 A | 6/1998 |

OTHER PUBLICATIONS

Chinese office Action for related Chinese Application No. 201310227234.5 dated Feb. 1, 2016, with English Translation.

Korean Office Action for Korean Application No. 10-2013-0073094, dated Jun. 10, 2015, with English Translation.

German Office Action dated Jan. 18, 2013 for corresponding German Patent Application No. DE 10 2012 211 147.6 with English translation.

* cited by examiner

AUTOMATIC DETUNING OF NON-CONNECTED TRANSCEIVER COILS FOR MRI

This application claims the benefit of DE 10 2012 211 147.6, filed on Jun. 28, 2012, which is hereby incorporated by reference.

BACKGROUND

The present embodiments relate to a device and method for detuning a local magnetic resonance tomography (MRT) coil not connected to the MRT.

A magnetic resonance device (e.g., an MRT device or a magnetic resonance imaging (MRI) device) for examination of objects or patients by magnetic resonance tomography is known, for example, from DE10314215B4, US2011/0291655A1 or DE10051155 C2.

SUMMARY

The scope of the present invention is defined solely by the appended claims and is not affected to any degree by the statements within this summary.

The present embodiments may obviate one or more of the drawbacks or limitations in the related art. For example, automatic detuning of a non-connected coil of a magnetic resonance imaging (MRI) system (e.g. a magnetic resonance tomography (MRT) system) is provided.

DETAILED DESCRIPTION OF THE DRAWINGS

Figure 7:
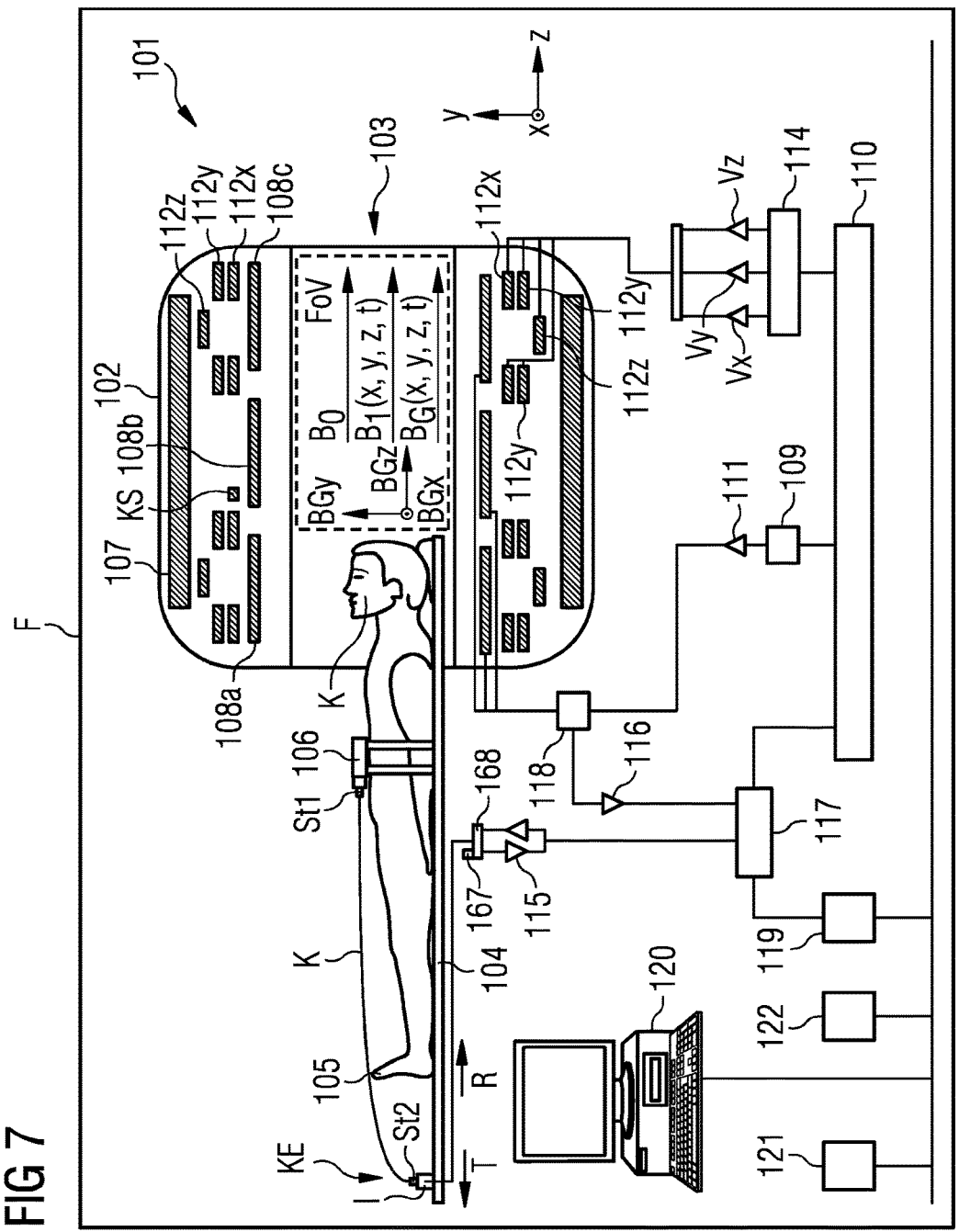
FIG. 7 shows a schematic of one embodiment of an MRT system.

FIG. 7 shows a magnetic resonance tomography (MRT) device 101 (e.g., a magnetic resonance imaging (MRI) device; located in a shielded room or Faraday cage F) with a whole body coil 102 with a tubular space 103, into which a patient couch 104 with a body (e.g., of an object to be examined such as a 105 with or without a local coil arrangement 106) may be moved in the direction of the arrow z in order to generate images of the patient 105 by an imaging method. The local coil arrangement 106 (e.g., an MRT local coil) is, for example, arranged on the patient. In a local area (e.g., field of view (FoV)) of the MRT device 101, images of a part area of the body 105 may be generated in the FoV with the local coil arrangement 106. Receive signals R from and/or transmit signals T to the local coil arrangement 106 may be evaluated by an evaluation device (e.g., including elements 168, 115, 117, 119, 120, 121) of the MRT device 101, which may be connected, for example, via a plug St1 on the local coil, a coaxial cable, a plug St2 at the free end of the (coaxial) cable K and an interface I on the patient couch 105 or wirelessly (167) to the local coil arrangement 106 (e.g., converted into images, stored or displayed).

In order to examine the body 105 (e.g., the object to be examined or the patient) with the MRT device 101 using magnetic resonance imaging, different magnetic fields matched as exactly as possible to one another in temporal and spatial characteristic are irradiated onto the body 105. A strong magnet (e.g., a cryomagnet 107) in a measurement chamber (e.g., with a tunnel-shaped opening 103) creates a statically strong main magnetic field $B_0$, which amounts, for example, to between 0.2 Tesla and 3 Tesla or even more. The body to be examined 105 is moved, supported on a patient couch 104, into a roughly homogeneous area of the main magnetic field $B_0$ in the FoV. An excitation of the nuclear resonance of atomic nuclei of the body 105 is brought about via magnetic high-frequency excitation pulses B1 ($x, y, z, t$) that may be irradiated via a high-frequency antenna shown in FIG. 7 simplified as a body coil 108 (e.g., a multipart coil 108a, 108b, 108c and/or a local coil arrangement). High-frequency excitation pulses are generated, for example, by a pulse generation unit 109 that is controlled by a pulse sequence control unit 110. After amplification by a high-frequency amplifier 111, the high-frequency excitation pulses are conveyed to the high-frequency antenna 108. The high-frequency system shown in FIG. 7 is merely indicated schematically. In other embodiments, more than one pulse generation unit 109, more than one high-frequency amplifier 111 and a number of high-frequency antennas 108a, b, c are used in the MRT device 101.

The MRT device 101 also has gradient coils 112x, 112y, 112z, with which, during a measurement, magnetic gradient fields $B_G$ (x, y, z, t) are radiated for selective slice excitation and for local encoding of the measurement signal. The gradient coils 112x, 112y, 112z are controlled by a gradient coil control unit 114 (e.g., if necessary via amplifiers Vx, Vy, Vz) that, like the pulse generation unit 109, is connected to the pulse sequence control unit 110.

Signals transmitted by the excited nuclear resonance of the atomic nuclei in the object under examination are received by the body coil 108 and/or at least one local coil arrangement 106, amplified by assigned high-frequency preamplifiers 116 and further processed and digitized by a receiver unit 117. The recorded measurement data is digitized and stored as complex numerical values in a k-space matrix. An associated MR image is reconstructable from the k-space matrix occupied by values using a multidimensional Fourier transformation.

For a coil that may be operated both in transmit mode and also in receive mode (e.g., the body coil 108 or a local coil 106), the correct signal forwarding is regulated by an upstream transceiver branch 118.

An image processing unit 119 creates an image from the measurement data. The image is displayed via an operating console 120 to a user and/or is stored in a memory unit 121. A central processor unit 122 controls the individual system components.

In MR tomography, images with a high signal-to-noise ratio (SNR) may be recorded with local coil arrangements. The local coil arrangements are antenna systems that are attached in the immediate vicinity at (e.g., anterior), below (e.g., posterior), on or in the body 105. During an MR measurement, the excited nuclei induce a voltage in the individual antennas of the local coil. The induced voltage is amplified by a low-noise preamplifier (e.g., LNA, preamp) and is forwarded to the receive electronics. To improve the signal-to-noise ratio even in high-resolution images, high-field systems are used (e.g., 1.5 T-12 T and more). If more individual antennas may be connected to an MR receive system than there are receivers available, a switching matrix (e.g., an RCCS) is integrated between receive antennas and receivers. This matrix routes the currently active receive channels (e.g., the receive channels that currently lie in the field of view of the magnet) to the available receivers. This makes it possible to connect more coil elements than there are receivers available, since for whole body coverage only the coils that are located in the FoV or in a homogeneity volume of the magnet are to be read out.

For example, a local coil arrangement 106 may be an antenna system that may include one or, as an array coil, a number of antenna elements (e.g., coil elements), for example. The individual antenna elements are, for example, configured as loop antennas (e.g., loops), butterfly coils, flex coils or saddle coils. A local coil arrangement may include coil elements, a preamplifier, further electronics (e.g., sheath current filters), a housing, supports and may include a cable with plug, through which the individual antenna elements are connected to the MRT system. A receiver 168 attached to the system-side filters and digitizes a signal received from the local coil 106 (e.g., wirelessly) and transfers the data to a digital signal processing device that may derive an image or a spectrum from the data obtained by a measurement and makes the image available to the user (e.g., for subsequent diagnosis by user and/or for storage).

Figure 4:
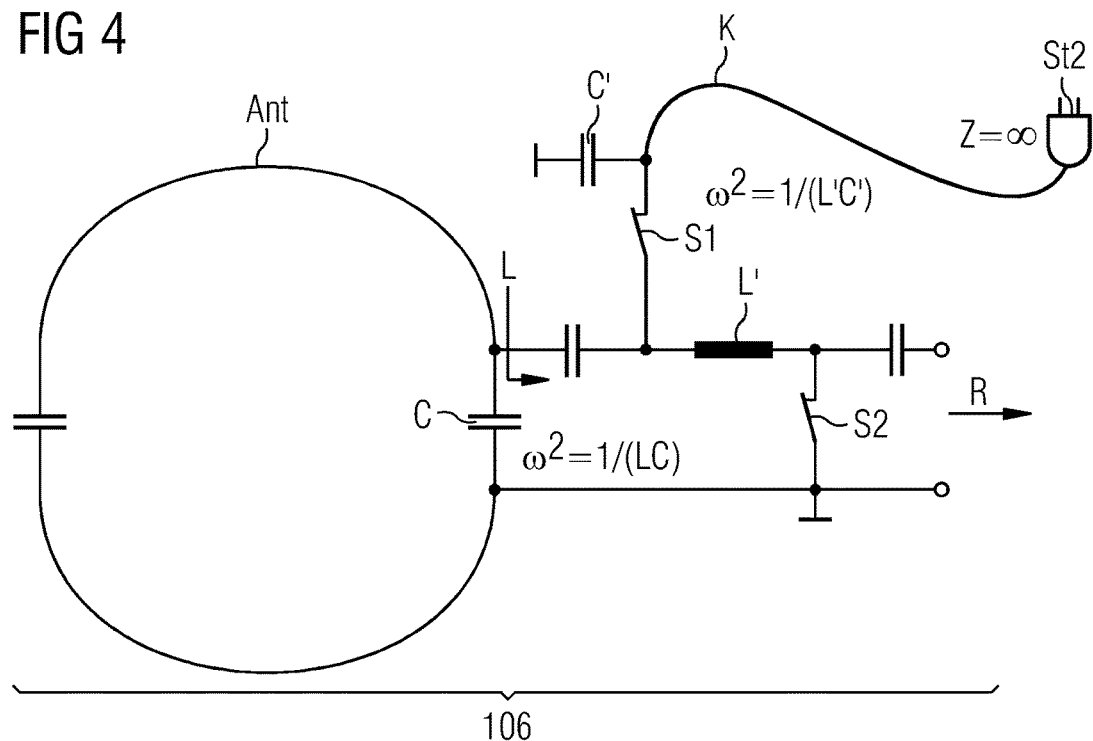
FIG. 4 shows a simplified diagram of one embodiment of a device and a non-connected connecting line of a local coil.
Figure 5:
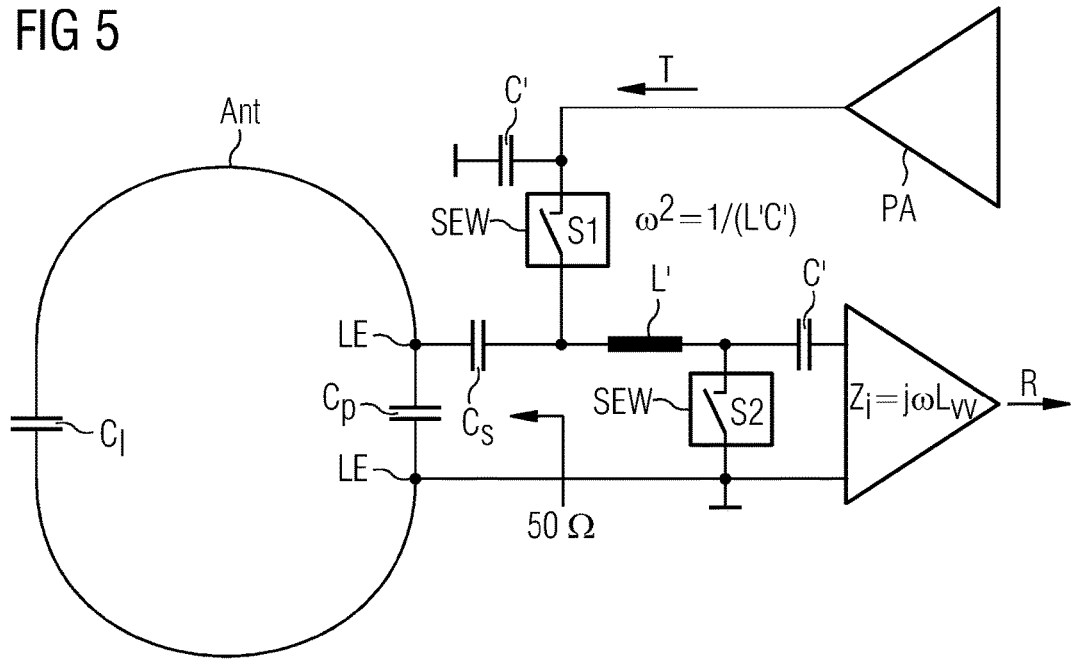
FIG. 5 shows a simplified diagram of one embodiment of a device.
Figure 6:
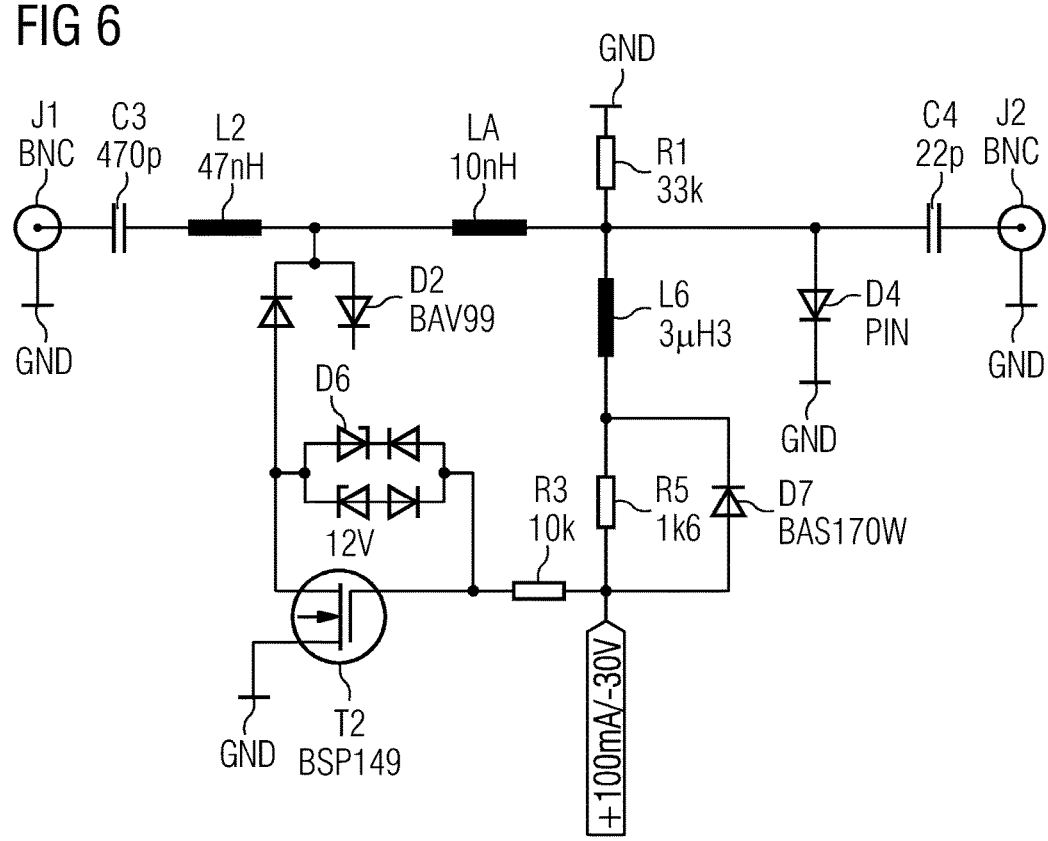
FIG. 6 shows a simplified diagram of one embodiment of a self-powered PIN diode from an MRT-RF field.

FIGS. 4-6 show embodiments for de-tuning a local MRT coil 106 not connected to the MRT device 101, but in the transmit range of the MRT device 101 and/or on a patient couch 104.

In nuclear resonance tomography, in addition to multi-channel receive array antennas (e.g., as local coils), multi-channel transmit array antennas are also increasingly being used. Various aims are pursued in such cases. First, for "B1 Shimming," the aim is to homogenize the B1 transmit field in a region of interest (ROI) by explicitly controlling the amplitudes and phases, in order to generate the most homogeneous possible image contrast. Next, for other pTX techniques, the k space (e.g., similarly to parallel RX techniques) may also be undersampled in the TX case (e.g., during transmission) in order to shorten the measurement times and/or pulse durations. In such cases, it is useful for the transmit antennas to have different modes (e.g., orthogonal modes).

For local coils, additional problems arise compared to coils installed permanently in the bore of the MRT, and new degrees of freedom are produced. First, with local coils, the problem of decoupling of the individual antennas is complex, since the location of the elements in relation to one another is not always defined (e.g., an antenna may include a number of parts able to be moved in relation to one another and/or an antenna may be mechanically flexible). Also, an advantage compared to the antenna integrated into the bore may be the lower power requirements, since the antennas (of local coils) may lie closer to the imaging volume FoV.

Exemplary embodiments may increase the safety of 1 ch (e.g., single-channel) and multi-channel TX coils (e.g., local coils embodied for transmission). Also, in accordance with IEC 60601 3rd edition, unplugged coils (e.g., local coils) may be taken into account if as an error case/operating error the plugging-in of the connecting cable of a local coil at the interface (e.g., at the patient couch) was forgotten.

Non-connected local coils may not be resonant during the transmission with the body antenna of an MRT, since there may be significant field overincreases in the vicinity of the body antenna, and a danger to the patient resulting therefrom may be reliably excluded.

With combined transmit and receive coils, commonly used measures for pure receive coils (e.g., passive detuning) are not successful. In normal operation, this is also not necessary because the antenna itself generates the transmit field, and the body antenna is deactivated. The transceiver antenna, however, is unplugged in the bore. The possibility arises of there being transmission with the body antenna and the result being endangering of the patient.

There is "passive detuning" of the local coils in the event of large signals (e.g., if an MRT device sends an excitation signal). This is based on the fact that a parallel oscillating circuit is tuned via antiparallel diodes conducting in a large signal manner at the resonant frequency. The resulting high impedance suppresses the current flow in the local coil so that no fields dangerous for the patient may arise.

Figure 1:
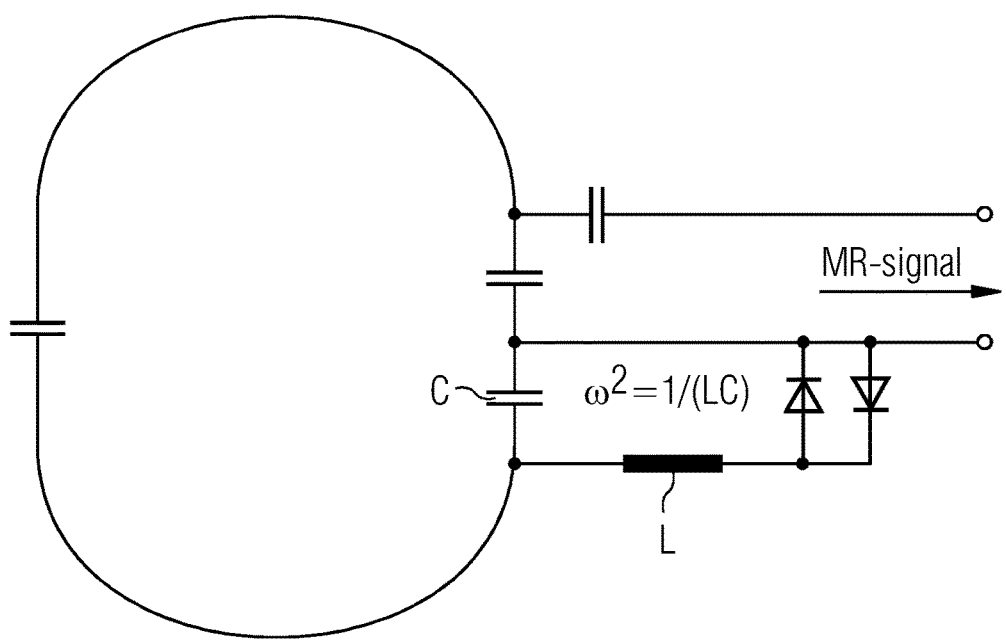
FIG. 1 shows passive detuning of the receive coil.

FIG. 1 shows a passive detuning of receive coils.

Figure 2:
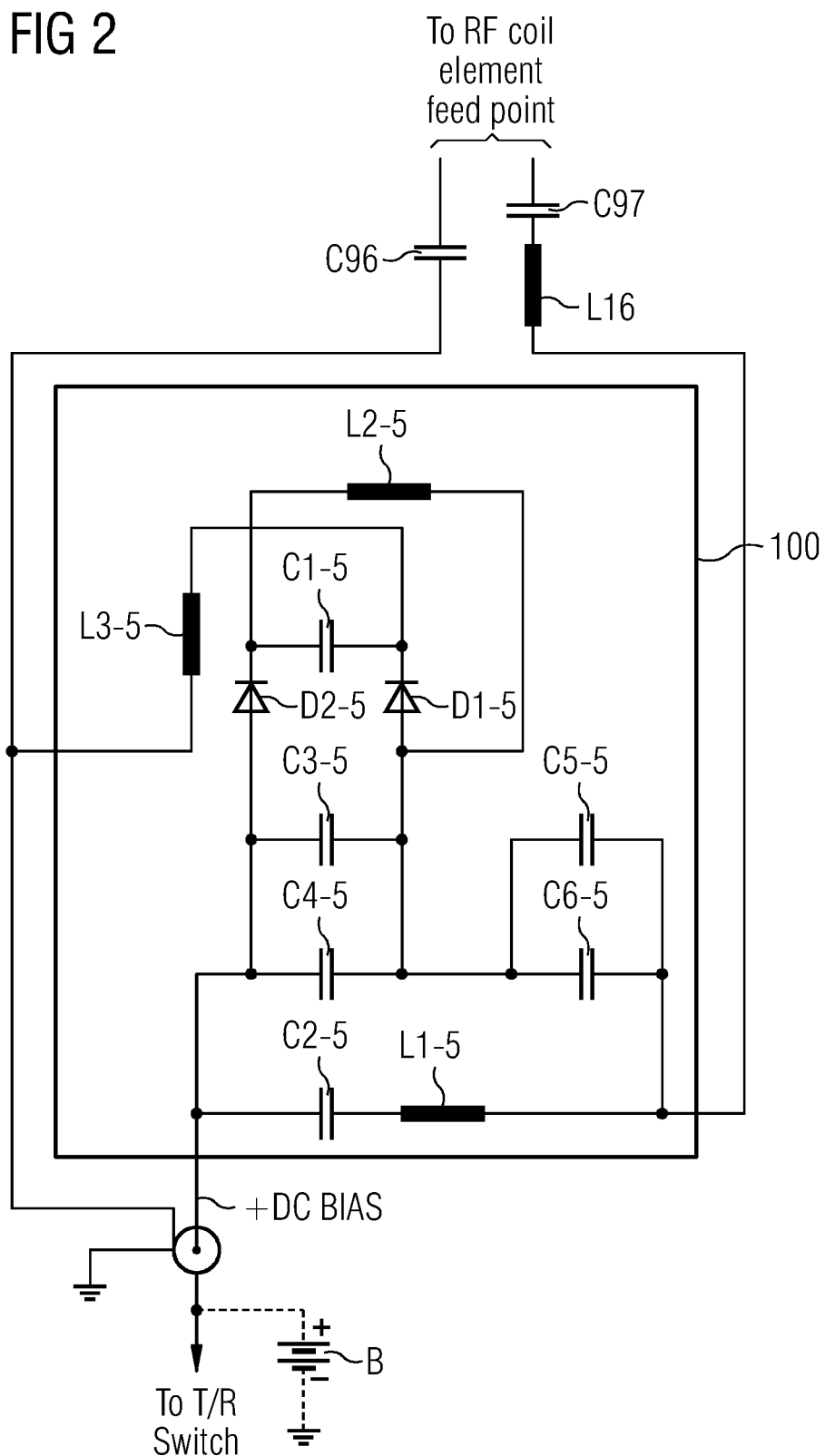
FIG. 2 shows a diagram from US 2011/0291655 A1.

In the diagram shown in FIG. 2 from patent US 2011/0291655 A1, additional safety switches inserted into the signaling path are proposed for solving the problem. In addition to the power electronics components (e.g., PIN diodes) additionally provided, these additional switching elements in practice also worsen the signal-to-noise ratio in receive mode.

Figure 3:
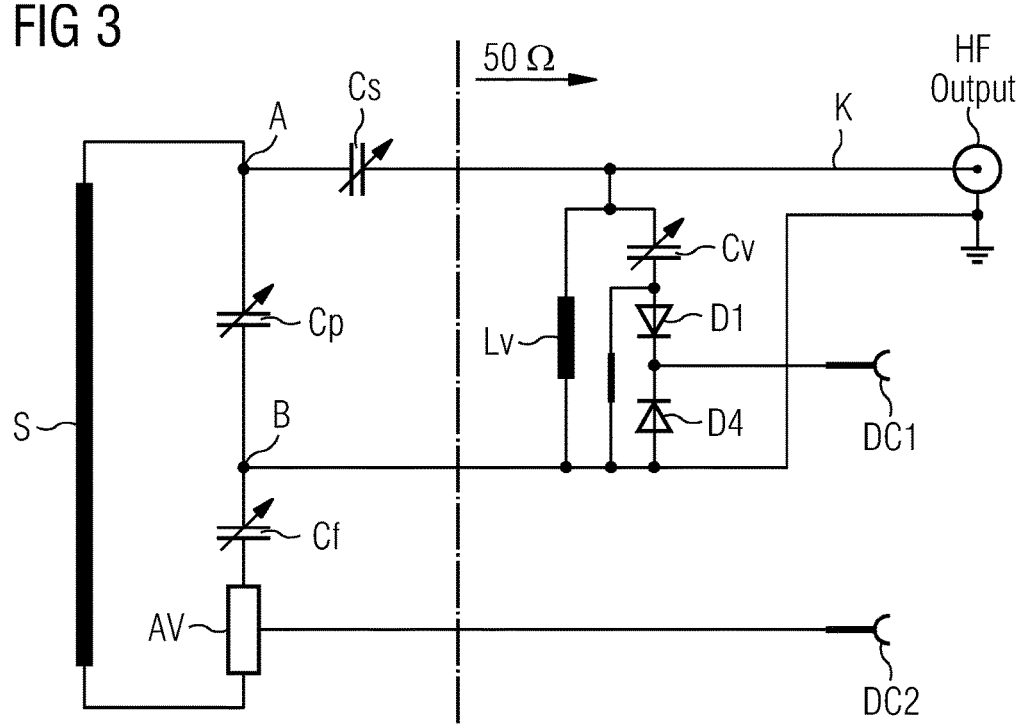
FIG. 3 shows a diagram from DE10051155 C2.

In the diagram shown in FIG. 3 from DE1005155 C2, a coil is proposed that is generally first tuned by an externally supplied signal at the MR frequency. Although the idea is aimed at receive coils, a use for transceiver coils may also be provided.

A transceiver branch provided in combined transceiver coils is put into a transmit state in accordance with one or more of the present embodiments by self-closing switches S1, S2 (e.g., closing by self-actuation and/or without being activated by a control) for the presence of RF power (e.g., from the MRT-RF field (B1($x$, $y$, $z$, $t$))). With a suitable selection of the length of the connecting cable, the idling unconnected cable end (e.g., the cable end KE of a connecting cable K of a local coil 106 that is not connected by a plug St2 into an interface I on a patient couch 105 or elsewhere at the MRT device 101) is transformed electrically into an inductance that, together with a coupling capacitor on the coil, forms a resonant parallel circuit and prevents or reduces the flow of current.

In FIG. 4, the TX plug St2 (e.g., a plug St 2 at the free end KE of the connecting cable K of a local coil 106) is not connected to the MRT device 101 (e.g., not plugged in to an interface I on a patient couch or elsewhere at the MRT device 101).

The arrow indicates an MR receive signal R generated by the local coil 106.

The switch (e.g., switch in the form of a self-powered PIN diode) S1 and/or S2 is self-closing, for example, for high RF power in the loop (e.g., in the antenna; generated by fields of the MRT).

In the realization of the self-closing switch or switches S1, S2, the switches S1, S2 may also be controllable from outside in normal operation.

Embodiments of such a circuit are described below.

For example, PIN diodes as switches S1, S2 are powered by, for example, 100 mA by the MR system 101 in the TX case (e.g., in the transmit case, if the local coil 106 receives transmit signals T from the MRT device 101 and is to transmit), and in the receive case, the PIN diodes are preset to an initial voltage of e.g. −30 V.

Patient protection against excessive fields with disconnected TX/RX coils (e.g., transmit and/or receive coils) is thus not optimized, for example, by additional switches that may adversely affect the receive characteristics, but by a modification of an available transceiver branch and a suitable design (e.g., electrical length) of the connecting cable(s) K.

FIG. 5 shows an exemplary embodiment with a transceiver branch SEW with two RF switches S1, S2 (e.g., PIN diodes). The exemplary embodiment (SEW) is also suitable for switching existing RX coils with the corresponding increase in the dielectric strength to TX/RX mode.

In the RX case (e.g., receive case; when the local coil 106 is receiving and/or the receive signals R are being transmitted to the MRT device 168, 117, 110, 101), both switches S1, S2 are open for this purpose (e.g., as negatively pre-powered PIN diodes). The preamplifier PA is directly connected via the series resonant circuit consisting of L' and C' as with fewer RX coils (e.g., receive-only local coils) to the antenna Ant. For example, no additional phase rotation between loop (e.g., antenna Ant) and preamplifier is introduced, so that the preamplifier coupling, 80-power reading out of the MR signals R, may be maintained.

In the TX case or transmit case (e.g., when transmit signals T are transmitted from the MRT device (101, 110, 117) to the local coil and/or when the local coil 106 is transmitting), both switches S1, S2 are closed. The preamplifier PA is isolated from the loop (e.g., from the antenna Ant) by a switch S2, and the coil L' is connected in parallel to the loop input LE. To compensate for this inductive load, an additional capacitor C' is provided after the switch S1 in parallel to the amplifier output. During transmission, L' and C' form a parallel resonant circuit that, because of the high resistance, remains "invisible" or without disruptive influence on the transmission.

FIG. 6 shows one embodiment with a PIN diode circuit self powered from the MRT RF field (e.g., supplied with power from the RF field) as a switch instead of the switch S2 in FIG. 5. By splitting the inductance labeled "L" in FIG. 5 into L2 and L4 in FIG. 6, RF voltage may be tapped off between the two, rectified and included for powering the PIN diode (PIN). The circuit also allows an active control of the switch S1 and/or S2. Examples for the electronic components are specified in the circuit. A first laboratory layout of the circuit has been successfully tested.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A device for automatic detuning of a magnetic resonance tomography (MRT) local coil of an MRT system, the device comprising:
   a transceiver branch comprising self-closing switches that are automatically closed or open depending on the presence of an MRT high-frequency field, the self-closing switches being in communication with the MRT local coil,
   wherein the MRT local coil comprises a connecting cable with a plug connectable to the MRT system, and wherein the MRT local coil is not connected to the MRT system via the connecting cable and plug during the detuning of the MRT local coil, and
   wherein the MRT local coil is configured for transmitting RF transmit signals and for receiving RF receive signals.

2. The device as claimed in claim 1, wherein the self-closing switches are configured so that, in a state with an MRT RF field present, the self-closing switches are closed by self-closing, and in a state without an MRT RF field, the self-closing switches are open.

3. The device as claimed in claim 1, wherein an inductance conditional on a length of the connecting cable of the MRT local coil forms a resonant parallel circuit together with a coupling capacitor on the MRT local coil.

4. The device as claimed in claim 1, wherein each of the self-closing switches is a PIN diode.

5. The device as claimed in claim 4, wherein the PIN diode is a PIN diode self-powered by the MRT-RF field.

6. The device as claimed in claim 1, wherein a switch of the self-closing switches is a switch that self closes for a strength of an MRT-RF field lying above a threshold value, the switch being open with a strength of an MRT-RF field lying below a threshold value.

7. The device as claimed in claim 1, wherein in a state in which transmit signals to be transmitted to the MRT local coil from the MRT system are present, the self-closing switches in the form of PIN diodes are powered with a current, in a state in which the MRT local coil transmits receive signals to the MRT system, the self-closing switches in the form of PIN diodes are pre-set with an initial voltage, or a combination thereof.

8. The device as claimed in claim 7, wherein the current is 100 mA, and wherein the initial voltage is −30 V.

9. The device as claimed in claim 1, wherein the self-closing switches are a part of one or the only transceiver branch of the MRT local coil, the self-closing switches of the transceiver branch are the only switches configured for the automatic detuning of the MRT local coil not connected to the MRT system, or a combination thereof.

10. The device as claimed in claim 1, wherein in a state in which the MRT local coil is transmitting receive signals to the MRT system, one or both of the self-closing switches are opened.

11. The device as claimed in claim 1, wherein in a state in which the MRT local coil is transmitting receive signals to the MRT system, a preamplifier is directly connected via a series resonant circuit to an antenna.

12. The device as claimed in claim 1, wherein in a state in which the MRT local coil is transmitting receive signals to the MRT system, no additional phase rotation is provided between an antenna and a preamplifier, a preamplifier decoupling, a zero-power reading out of the receive signals, or the preamplifier decoupling and the zero-power reading out of the receive signals are provided, or any combination thereof.

13. The device as claimed in claim 1, wherein in a state in which the MRT local coil is receiving transmit signals to be transmitted from the MRT system, both of the self-closing switches are closed, a preamplifier is isolated from an antenna, a coil is connected in parallel to an antenna input, or any combination thereof.

14. The device as claimed in claim 1, wherein a capacitor is provided between a switch of the self-closing switches and an amplifier output of a preamplifier.

15. The device as claimed in claim 1, wherein in a state in which the MRT local coil is receiving transmit signals to be transmitted from the MRT system, a coil and a capacitor form a parallel resonant circuit that is at high resistance, without influence on the transmission of the transmit signals, or a combination thereof.

16. The device as claimed in claim 1, wherein an RF voltage generated by an MRT-high-frequency field is present between two coils connected in series with each other, the RF voltage being provided rectified for powering at least one PIN diode.

17. The device as claimed in claim 1, further comprising a controller configured for active control of the self-closing switches, the controller being a controller of the MRT system, a controller of the MRT local coil, or a controller of the MRT system and the MRT local coil.

18. A magnetic resonance tomography (MRT) local coil comprising:
   a connecting cable with a plug that is connectable to an MRT system; and
   a device for automatic detuning of the MRT local coil when the MRT local coil is not connected to the MRT system via the connecting cable and the plug, the device comprising:
   a transceiver branch comprising self-closing switches that are automatically closed or open depending on the presence of an MRT high-frequency field, the self-closing switches being in communication with the MRT local coil,
   wherein the MRT local coil is configured for transmitting RF transmit signals and for receiving RF receive signals.

19. A method for automatic detuning of a local magnetic resonance tomography (MRT) coil of an MRT system, the method comprising:
   closing self-closing switches when an MRT high-frequency field is present, the self-closing switches being in communication with the local MRT coil,
   wherein the MRT local coil comprises a connecting cable with a plug that is connectable to the MRT system, and
   wherein the MRT local coil is not connected to the MRT system via the connecting cable and the plug during the detuning of the MRT local coil,
   wherein the self-closing switches are open in the absence of the MRT high-frequency field, and
   wherein the local MRT coil is configured for transmitting RF transmit signals and for receiving RF receive signals.

* * * * *